United States Patent
Moon et al.

(10) Patent No.: US 9,981,850 B2
(45) Date of Patent: May 29, 2018

(54) ELECTRICALLY CONDUCTIVE THIN FILMS

(71) Applicant: SAMSUNG ELECTRONICS CO., LTD., Suwon-si, Gyeonggi-do (KR)

(72) Inventors: Kyoung-Seok Moon, Hwaseong-si (KR); Sang Il Kim, Seoul (KR); Se Yun Kim, Seoul (KR); Hee Jung Park, Suwon-si (KR); Hyosug Lee, Suwon-si (KR); Jae-Young Choi, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 164 days.

(21) Appl. No.: 14/719,428

(22) Filed: May 22, 2015

(65) Prior Publication Data

US 2015/0344307 A1  Dec. 3, 2015

(30) Foreign Application Priority Data

May 27, 2014 (KR) .................. 10-2014-0064011

(51) Int. Cl.
| | |
|---|---|
| *C01B 19/04* | (2006.01) |
| *C01B 19/00* | (2006.01) |
| *H01L 21/02* | (2006.01) |
| *H01B 1/06* | (2006.01) |

(52) U.S. Cl.
CPC ........... *C01B 19/007* (2013.01); *C01B 19/04* (2013.01); *H01B 1/06* (2013.01); *H01L 21/02562* (2013.01); *C01P 2006/40* (2013.01); *Y02E 10/50* (2013.01); *Y02E 10/54* (2013.01)

(58) Field of Classification Search
CPC .................................................. C01B 19/04
See application file for complete search history.

(56) References Cited

U.S. PATENT DOCUMENTS

2013/0302593 A1  11/2013  Coleman et al.

FOREIGN PATENT DOCUMENTS

| CN | 102938262 A | 2/2013 |
|---|---|---|
| JP | 2000335111 A | 12/2000 |
| JP | 3415099 B2 | 4/2003 |
| JP | 2007-91578 A | 4/2007 |
| KR | 10-0576847 B1 | 4/2006 |
| KR | 10-0959163 B1 | 5/2010 |
| WO | 2014/064432 A1 | 5/2014 |

OTHER PUBLICATIONS

Dey et al., "Platinum Group Metal Chalcogenides", Platinum Metals Rev., 2004, 48, (1), pp. 16-29, Bhabha Atomic Research Centre in Mumbai, India; which is attached as a PDF.*
Huang et al., "Metal dichalcogenide nanosheets: preparation, properties, and applications", Chem. Soc. Rev., published Jan. 23, 2013, 42, pp. 1934-1946, © The Royal Society of Chemistry 2013; accessible online within the www.resc.org/csr website; this document is attached as a PDF.*
Chhowalla et al., "The chemistry of two-dimensional layered transition metal dichalcogenide nanosheets", Nature Chemistry, vol. 5, 2013, pp. 263-275.
Dey et al., "Chalcogenides", Platinum Group Metal Chalcogenides, Platinum Metals Rev., vol. 48(1), 2004, pp. 16-29.
Extended European Search Report for European Patent Application No. 15168194.7 dated Nov. 11, 2015.
Pell et al., "PdTe2", Acta Cryst.,vol. C52, No. 6, 1996, pp. 1331-1332.
Rasmussen et al., "Computational 2D Materials Database: Electronic Structure of Transition-Metal Dichalcogenides and Oxides", The Journal of Physical Chemistry, vol. 119, No. 23, 2015, pp. 13169-13183.
Chinese Office Action for Chinese Patent Application No. 201510275760.8 dated Jul. 3, 2017 with English translation.

* cited by examiner

*Primary Examiner* — Katie L Hammer
(74) *Attorney, Agent, or Firm* — Cantor Colburn LLP

(57) ABSTRACT

An electrically conductive film including a compound represented by Chemical Formula 1 and having a layered crystal structure:

$$MeCh_2 \qquad \text{Chemical Formula 1}$$

wherein, Me is Ru, Os, Re, Rh, Ir, Pd, Pt, Cu, Ag, or Au, and Ch is sulfur, selenium, tellurium, or a combination thereof.

18 Claims, 9 Drawing Sheets

No oxidation layer is present

No oxidation layer is present

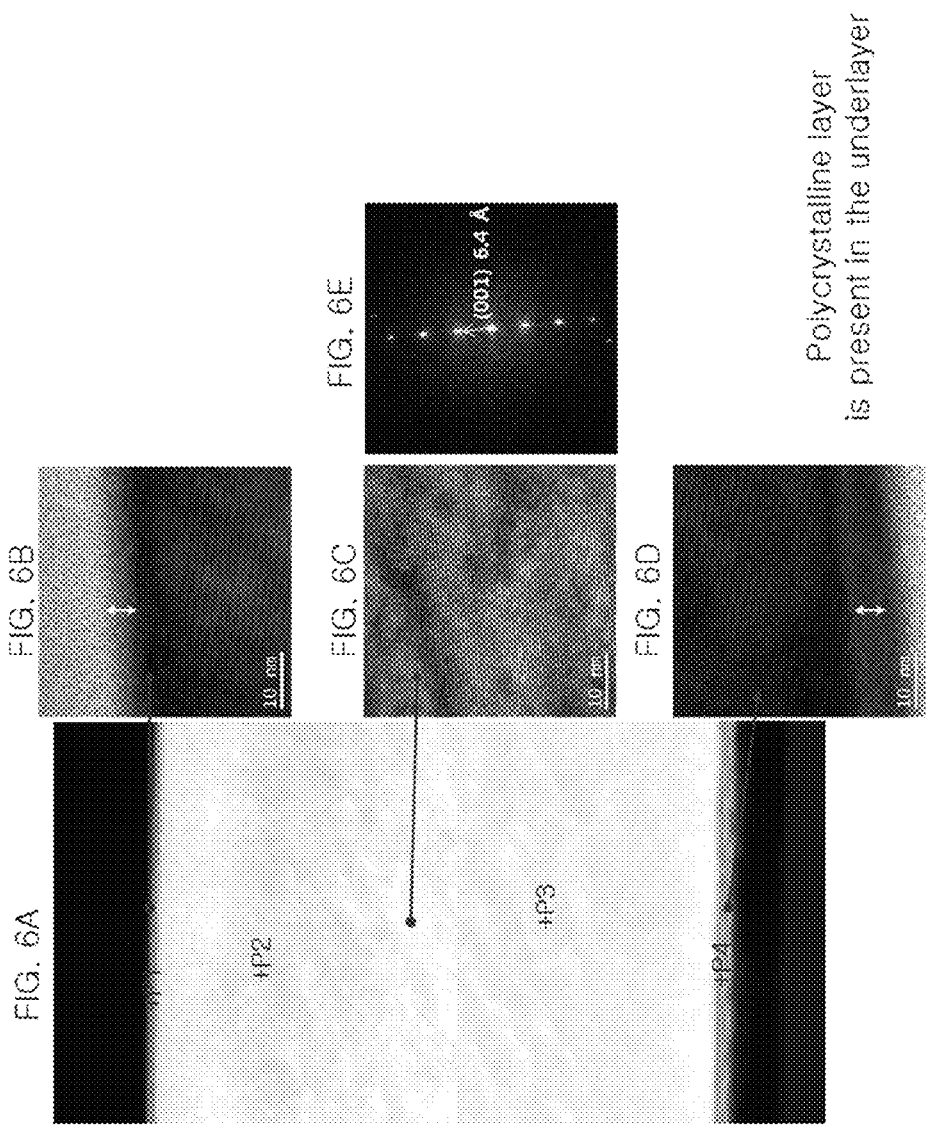

ELECTRICALLY CONDUCTIVE THIN FILMS

CROSS REFERENCE TO RELATED APPLICATION

This application claims priority to and the benefit of Korean Patent Application No. 10-2014-0064011, filed in the Korean Intellectual Property Office on May 27, 2014, and all the benefits accruing therefrom under 35 U.S.C. § 119, the entire content of which is incorporated herein by reference.

BACKGROUND

1. Field

An electrically conductive thin film and an electronic device including the same are disclosed.

2. Description of the Related Art

An electronic device, such as a flat panel display such as a liquid crystal display (LCD) or a light emitting diode (LED) display, a touch screen panel, a solar cell, a transparent transistor, or the like includes an electrically conductive thin film which may be transparent. A material for an electrically conductive thin film may have, for example, a light transmittance of greater than or equal to about 80% and specific resistance of less than or equal to about 100 microohms-centimeters ($\mu\Omega*cm$) in a visible light region. Currently available oxide materials for an electrically conductive thin film include indium tin oxide (ITO), tin oxide ($SnO_2$), zinc oxide (ZnO), and the like. ITO has poor flexibility and may cost more due to limited reserves of indium. Therefore, development of an alternative material is desired. Also, tin oxide and the zinc oxide have low conductivity and poor flexibility.

In order to develop a flexible electronic device (such as bendable or foldable electronic device) that is drawing attention as the next generation electronic device, the development of a material for a flexible and stable transparent electrode having high transparency and excellent electrical conductivity is needed.

SUMMARY

An embodiment provides a flexible and electrically conductive thin film having high conductivity and excellent light transmittance.

Another embodiment provides an electronic device including the electrically conductive thin film.

In an embodiment, an electrically conductive thin film includes: a compound represented by Chemical Formula 1 and having a layered crystal structure:

$$MeCh_2 \qquad \text{Chemical Formula 1}$$

wherein Me is Ru, Os, Re, Rh, Ir, Pd, Pt, Cu, Ag, or Au, and Ch is sulfur, selenium, tellurium, or a combination thereof.

The electrically conductive thin film may have transmittance of greater than or equal to about 80% for light having a wavelength range of 550 nm at a thickness of less than or equal to 50 nm.

The compound represented by Chemical Formula 1 may be a ditelluride compound.

The compound represented by Chemical Formula 1 may include $PdTe_2$, $AgTe_2$, $IrTe_2$, $PtTe_2$, $AuTe_2$, or a combination thereof.

In an embodiment, the electrically conductive thin film does not include a surface oxide layer.

The electrically conductive thin film may be monocrystalline.

The electrically conductive thin film may have an electrical conductivity of greater than or equal to about 10,000 Siemens per centimeter (S/cm).

The compound may have a product of an absorption coefficient ($\alpha$) for light having a wavelength of 550 nm (e.g., at a temperature of 25° C.) and a resistivity value ($\rho$) thereof of less than or equal to about 30 ohms per square ($\Omega/\square$).

The layered crystal structure may belong to a hexagonal system and have a space group of P$\bar{3}$m1 (space group number 164).

The electrically conductive thin film may include a plurality of nanosheets including the compound, and the nanosheets may contact each other to provide an electrical connection.

The electrically conductive thin film may include a continuous deposition film including the compound.

Another embodiment provides an electronic device including an electrically conductive film including a compound being represented by Chemical Formula 1 and having a layered crystal structure:

$$MeCh_2 \qquad \text{Chemical Formula 1}$$

wherein Me is Ru, Os, Re, Rh, Ir, Pd, Pt, Cu, Ag, or Au, and Ch is sulfur, selenium, tellurium, or a combination thereof.

The electronic device may be a flat panel display, a touch screen panel, a solar cell, an e-window, an electrochromic mirror, a heat mirror, a transparent transistor, or a flexible display.

In an embodiment, the metal dichalcogenide may have a conductivity that is comparable to or far greater than that of indium tin oxide (ITO), and at the same time may exhibit enhanced light transmittance in a visible region. In addition, the metal dichalcogenide is an exfoliable layered material and may be prepared as a thin film having enhanced flexibility. In addition, the metal dichalcogenide has improved oxidation stability and thus may provide a thin film having substantially no surface oxidation layer.

Also disclosed is a method of preparing an electrically conductive film, the method including: providing a compound represented by Chemical Formula 1 and having a layered crystal structure:

$$MeCh_2 \qquad \text{Chemical Formula 1}$$

wherein Me is Ru, Os, Re, Rh, Ir, Pd, Pt, Cu, Ag, or Au, and Ch is sulfur, selenium, tellurium, or a combination thereof; and exfoliating the compound represented by Chemical Formula 1 to prepare the electrically conductive film.

BRIEF DESCRIPTION OF THE DRAWINGS

The above and other aspects, advantages and features of this disclosure will become more apparent by describing in further detail exemplary embodiments thereof with reference to the accompanying drawings, in which:

FIGS. 4A to 4C show the results energy dispersive X-ray spectroscopic analysis of an exfoliated sample obtained by mechanical exfoliation from a PtTe₂ polycrystalline sintered body of Example 3, in which FIG. 4A is a scanning electron microscope (SEM) image, FIG. 4B is a graph of counts versus energy (kiloelectron volts, keV) for location 1 in FIG. 4A, and FIG. 4C is a graph of counts versus energy (kiloelectron volts, keV) for location 2 in FIG. 4A;

FIGS. 5A and 5B are transmission electron microscopic images of an exfoliated sample obtained by mechanical exfoliation from a PdTe₂ polycrystalline sintered body of Example 4, in which FIG. 5B is an enlarged view of the surface shown in FIG. 5A showing that no oxidation layer is present;

FIGS. 6A to 6E show the results a transmission electron microscopic and energy dispersive X-ray spectroscopic analysis of an exfoliated sample obtained by mechanical exfoliation from a TiTe₂ polycrystalline sintered body in Comparative Example 1 in which FIGS. 6B to 6D are enlarged views of the indicated portions of FIG. 6A showing that a polycrystalline layer is present in the underlayer.

DETAILED DESCRIPTION

Figure 1:
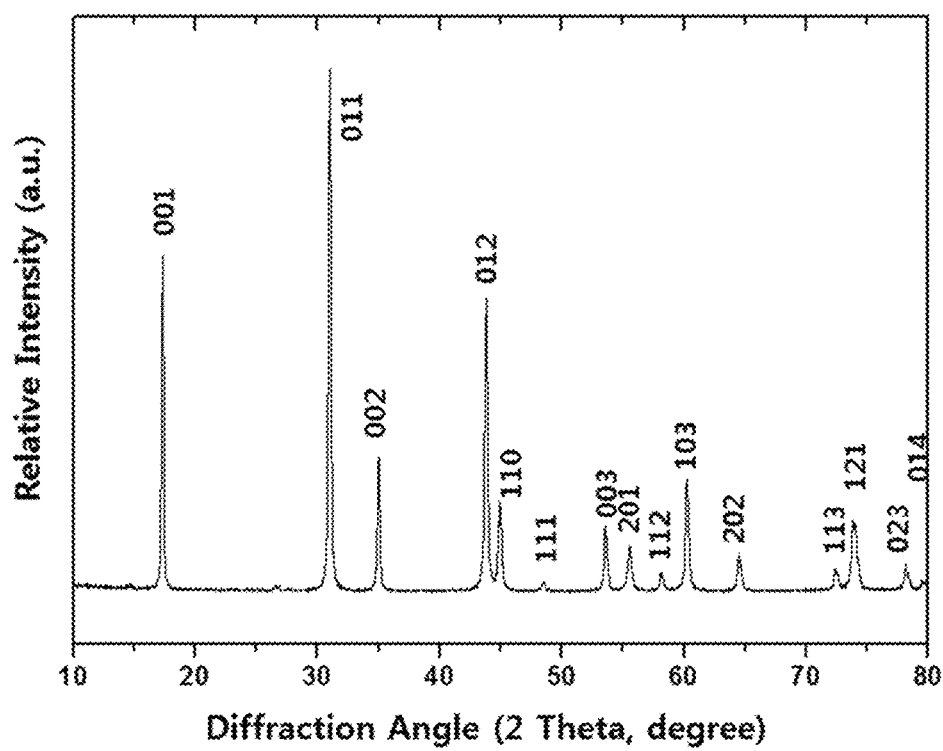
FIG. 1 is a graph of relative intensity (arbitrary units) versus diffraction angle (degrees two-theta, ° 2θ) and is an X-ray diffraction spectrum of a $PdTe_2$ polycrystalline sintered body prepared from Example 1.

Advantages and characteristics of this disclosure, and a method for achieving the same, will become evident referring to the following exemplary embodiments together with the drawings attached hereto. However, this disclosure may be embodied in many different forms and is not be construed as limited to the embodiments set forth herein; rather, these embodiments are provided so that this disclosure will fully convey the scope of the invention to those skilled in the art. Therefore, in some embodiments, well-known processes and technologies are not explained in detail for clarity. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements. Thus the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, the singular includes the plural unless mentioned otherwise. Thus the singular forms "a," "an," and "the" are intended to include the plural forms, including "at least one," unless the context clearly indicates otherwise.

In the drawings, the thickness of layers, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In an embodiment, an electrically conductive thin film comprises a compound represented by Chemical Formula 1 and having a layered crystal structure:

Chemical Formula 1 wherein Me is Ru, Os, Re, Rh, Ir, Pd, Pt, Cu, Ag, or Au, and Ch is sulfur, selenium, tellurium, or combination thereof.

The compound may be ditelluride compound, and thus Ch may be tellurium. The compound may include PdTe₂, AgTe₂, IrTe₂, PtTe₂, AuTe₂, or a combination thereof. In an embodiment, the electrically conductive thin film does not substantially include a surface oxide layer. For example, the electrically conductive thin film includes nanosheets including a compound represented by Chemical Formula 1 and having a layered crystal structure wherein the nanosheets do not include a surface oxide layer. The electrically conductive thin film may include a monocrystalline compound, a polycrystalline compound, or combination thereof.

In an embodiment, the electrically conductive thin film has a high electrical conductivity together with a high level of light transmittance, and thus may be advantageously utilized in an application which values high conductivity and high transparency (e.g., a transparent electrode). By way of an example, the electrically conductive thin film may have a light transmittance of greater than or equal to about 80%, for example, greater than or equal to about 85%, or greater than or equal to about 90%, about 80% to about 99%, or about 85% to about 98%, for light at a wavelength range of 550 nanometers (nm) at a thickness of less than or equal to 50 nm. Together with such a high level of light transmittance, the electrically conductive thin film may have a relatively high level of electrical conductivity, for example, an electrical conductivity greater than or equal to about 10,000 Siemens per centimeter (S/cm), about $1\times10^4$ S/cm to about $1\times10^6$ S/cm, or about $5\times10^4$ S/cm to about $5\times10^5$ S/cm.

Transition metal dichalcogenides (hereinafter also referred to as TMDC) have an electrical conductivity comparable to that of a semiconductor, but they are recognized as opaque materials. Therefore, only a few attempts have been made to use them as a transparent conductive film. For example, there was an attempt to prepare a very thin film (having a thickness of a few nanometers) of the transition metal dichalcogenides showing high transmittance in a visible region. However, the transition metal dichalcogenides tend to be susceptible to oxidation when prepared as nanosheets via the exfoliation process. Therefore, the electrical properties of the resulting material may be disadvantageously and sharply reduced. Therefore, even though the transition metal dichalcogenide may form nanosheets, it has been difficult to obtain a transparent conductive film including the transition metal dichalcogenide. By contrast, the nanosheets including the dichalcogenide compound of Chemical Formula 1, which have a layered crystal structure, have greatly enhanced oxidation stability in comparison with other transition metal dichalcogenide compounds, and thus have improved exfoliation properties and can be prepared as nanosheets without significant oxidation. Therefore, according to an embodiment, an electrically conductive thin film prepared therefrom does not include, or effectively does not include, a surface (or internal) oxide layer. In an embodiment, an oxide content of the electrically conductive thin film may be less than about 2 wt %, for example, less than about 1 wt %, less than about 0.1 wt %, about 0.001 weight percent (wt %) to about 2 wt %, about 0.005 wt % to about 1 wt %, or about 0.01 wt % to about 0.1 wt %, based on a total weight of the electrically conductive film.

In an embodiment, the electrically conductive thin film has a relatively high level of conductivity of greater than or equal to about 4000 S/cm, for example, greater than or equal to about 5000 S/cm, greater than or equal to about 6000 S/cm, greater than or equal to about 7000 S/cm, greater than or equal to about 10,000 S/cm, or even greater than or equal to about 30,000 S/cm, or about $4\times10^3$ S/cm to about $1\times10^6$ S/cm, or about $8\times10^4$ S/cm to about $5\times10^5$ S/cm.

Various efforts have been made to develop a flexible transparent electrode material having improved electrical conductivity and being transparent in the visible range. Metals have high electron density and high electrical conductivity. However, most metals tend to react with oxygen in air to form an oxide on their surface and thus exhibit greatly reduced electrical conductivity when in contact with air. In addition, there was an attempt to reduce surface contact resistance using a ceramic material having good conductivity and showing reduced surface oxidation. However, the currently available conductive ceramic materials (such as ITO) have difficulties of an unstable supply of raw materials.

Moreover, they do not provide an electrical conductivity comparable to that of a metal and their flexibility tends to be poor.

By contrast, the disclosed electrically conductive film including a compound of Chemical Formula 1 provides high conductivity and high transparency together with a high level of oxidation stability. In addition, the compound of Chemical Formula 1 has a layered crystal structure. In such a structure, unit structure layers are connected with each other via a Van der Waals force and thus may undergo sliding between the layers, and they may be prepared as nanosheets via mechanical exfoliation or liquid phase exfoliation. Therefore, the electrically conductive thin film of some embodiments may provide an improved level of flexibility suitable for use in a flexible electronic device.

The compound of Chemical Formula 1 may have a product of an absorption coefficient ($\alpha$) for light having a wavelength of 550 nm at 25° C. and a resistivity value ($\rho$) thereof of less than or equal to about 30 ohms per square ($\Omega/\square$). The absorption coefficient and the resistivity may be obtained from a computer simulation. The resistivity ($\rho$) may be obtained by calculating the density of states (DOS) and the band structure around the Fermi level from the crystal structure of the corresponding rare earth element chalcogenide compound. In addition, the absorption coefficient ($\alpha$) for a certain wavelength may be calculated from the dielectric constant of the compound that is obtained by applying the Drude model and considering electron transition due to interband transition. As to simulation methodology for providing the absorption coefficient ($\alpha$) and the resistivity ($\rho$), it is possible to further refer to the Vienna Ab-initio Simulation Package (written by Georg Kresse and Jurgen Furthmuller, Institut fur Materialphysik, Universitat Wien, Sensengasse 8, A-1130 Wien, Austria, Aug. 24, 2005, http://cms.mpi.univie.ac.at/VASP/), which is incorporated herein by reference in its entirety. The aforementioned simulation procedures are summarized in Table 1.

TABLE 1

| Calculation | Simulation level | Calculation/simulation |
|---|---|---|
| Atom electron structure | DFT | Structure optimization<br>Band structure calculation |
| Conductive characteristic | Semi-classical Boltzmann transport (const. $\tau$) | Intraband transition<br>$\sigma \approx (e^2/4\pi^3) \tau \int dk\, v(k)\, v(k)\, (-\partial f/\partial \in) =$ $ne^2 \tau/m_{eff} = ne\, \mu$<br>$\rho = 1/\sigma$ |
| Dielectric characteristic | DFPT + Drude model | Interband transition<br>$\in(\omega) = \in_D(\omega) + \in_B(\omega) = \in_1(\omega) + i \in_2(\omega)$ |
| Optical characteristic Calculate $\rho\, \alpha$ | Ray optics | $n(\omega) + i\, k(\omega) = \in(\omega)^{1/2}$<br>Absorption coeff. $\alpha = 4\pi k/\lambda$ |

In Table 1 following abbreviations are used:
DFT: density-functional theory;
DFPT: density-functional perturbation theory;
Drude model: free electron model for a solid;
$\sigma, \tau, m_{eff}, \mu, \rho$: electrical conductivity, relaxation time, effective mass, mobility, resistivity; and Hereinbelow, the description of Table 1 is explained in further detail.

In order to calculate a quantum mechanical state of a material, a first-principles calculation (a calculation made from a fundamental equation without using extrinsic parameters) based on the density-functional-theory (DFT) method (a method of solving a quantum mechanical equation by describing the electron distribution using an electron density function instead of a wave function) is performed to calculate the quantum mechanical state of an electron. The VASP (Vienna Ab initio simulation package code, which is a first principles DFT code) is used to calculate the electron state. A candidate material group including a two-dimensional electron gas (2DEG) layer is selected from the Inorganic Crystal Structure Database (ICSD). The atomic structure information for the candidate material is input and the energy level of the electrons may be calculated by simulation, and for such electrons, an energy density function and a state density function on a k-space of the electrons are calculated.

The electron structure calculated through the DFT computer simulation provides an E-k diagram (the band structure) and DOS (Density of States: electron state density, electron state density function per energy unit) information, making it possible to determine whether the given material is a metallic conductive material (DOS($E_F$)>0) or a semiconductor material (DOS($E_F$)=0) depending on the presence of the DOS on the maximum energy level ($E_F$) available to the electrons.

In order to predict the conductivity (σ) of a metallically conducting material, its conductive characteristics are estimated by introducing a semi-classical Boltzmann transport model. In this case, relaxation time of electrons (τ: duration during which an electron can move without collision) is assumed to be constant (see N. W. Ashcroft and N. D. Mermin, Solid State Physics, Holt, Rinehart and Winston, 1976, the content of which in incorporated herein by reference in its entirety).

$$\sigma=(e^2/4\pi^3)\tau\int dk v(k)v(k)(-\partial f/\partial E) \quad \text{Boltzmann-Transport}$$

Herein, τ is a relaxation time of an electron, k is a state of the electron in the k-space, v(k) is a speed of the electron in the k state, f is the Fermi-Dirac distribution function, and E is energy. In this case, v(k) may be calculated from the E-k diagram, and σ/τ may be obtained from the above formula.

The mechanism determining the transmittance or the absorption of the conductive material may include intraband absorption due to plasma-like oscillation of free electrons and interband absorption due to band-to-band transition of bound electrons. The quantum computational simulation process considering each of the mechanisms may be obtained by the process as set forth in Table 2 (see N. W. Ashcroft and N. D. Mermin, Solid State Physics, Holt, Rinehart and Winston, 1976).

TABLE 2

Simulation Table for Optical Properties

| STEP | Category | Calculation | Results | Method (tool) |
|---|---|---|---|---|
| 1 | Optical simulation | Interband transition | ∈B(w) = ∈B1(w) + i ∈ B2(w) | DFT (VASP) |
| 2 | Optical simulation | Plasma frequency intraband transition | ∈ D(w) = ∈ D1(w) + i ∈ D2(w) | Boltzmann transport DFT (VASP) or post-processing |
| 3 | Optical simulation | Total dielectric constant refractive index | | Post-processing |
| 4 | Optical simulation | Reflectance absorption coefficient | Plasma freq. reflectance absorption co. transmittance | Post-processing |

Herein, B denotes a band, and D denotes a Drude model.

In this case, the relationships of the dielectric constant (∈), the refractive index (n), and the absorption coefficient (α) of a solid are shown as follows. For the dielectric constant, both the interband transition related portion ($\in_{(Band)}$) and the intraband transition related portion ($\in_{(Drude)}$) should be considered.

$$\varepsilon(\omega) = \varepsilon_{(Drude)} + \varepsilon_{(Band)}$$
$$\varepsilon_1(\omega) + i\varepsilon_2(\omega) \quad \text{dielectric function}$$
$$(n + ik)^2 = \varepsilon(\omega) \quad \text{refraction function}$$
$$\alpha(\omega) = 4\pi k/\lambda \quad \text{absorption coefficient}$$

As set forth in the above conductivity calculation, the interband absorption may be calculated through the band structure as calculated in advance, while the intraband absorption by the free electrons is calculated by the simulation as below through the conductivity and optical coefficient calculation based on the Drude modeling (see Jin-woong Kim, Journal of Applied Physics 110, 083501 2011, the content of which is incorporated herein in its entirety by reference).

*CGS* UNIT $$\sigma(\omega) = \sigma_0/[1 - i\omega\tau] \quad \text{AC conductivity}$$
$$\sigma_0 = ne^2\tau/m \quad \text{DC conductivity}$$
$$\varepsilon(\omega) = 1 + i(4\pi/\omega)\sigma(\omega)$$
$$\omega_p^2\tau = \sigma_0/\varepsilon_0 \quad (si)$$
$$= 4\pi\sigma_0 \quad (cgs)$$
$$\varepsilon(\omega) = 1 + i(4\pi/\omega)\sigma_0/[1 - i\omega\tau]$$
$$= 1 - (4\pi\sigma_0/\omega)/[i + \omega\tau]$$
$$= 1 - (4\pi\sigma_0/\omega)(-i + \omega\tau)/[1 + (\omega\tau)^2]$$
$$= 1 - (\omega_p\tau)^2/[1 + (\omega\tau)^2] + i(\omega_p\tau)^2/[\omega\tau(1 + (\omega\tau)^2)]$$

$$\in_1 = 1 - \frac{\omega_p^2\tau^2}{1 + \omega^2\tau^2} \quad n = \frac{1}{\sqrt{2}}(\in_1 + (\in_1^2 + \in_2^2)^{1/2})^{1/2}$$

$$\in_2 = \frac{\omega_p^2\tau^2}{\tau\omega(1 + \omega^2\tau^2)} \quad \kappa = \frac{1}{\sqrt{2}}(-\in_1 + (\in_1^2 + \in_2^2)^{1/2})^{1/2}$$

ω: frequency
$\omega_p$: plasma frequency
k: extinction coefficient

As such, the calculation of the interband absorption and the intraband absorption makes it possible to calculate the dielectric function of the given material, and the optical constants thereof can be simulated therefrom. In the end, the reflectance (R), the absorption coefficient (α), and the transmittance (T) of the given material can be calculated therefrom.

In accordance with the foregoing method, the product of the absorption coefficient (α) and the resistivity (ρ) for various metal dichalcogenides is compiled in Table 3.

TABLE 3

| Composition | ρ (Ω*cm) | α (1/cm) | αρ (Ω/□) | $R_s = C\alpha\rho(\Omega/\square)$ at Transmittance >0.90 |
|---|---|---|---|---|
| $CuTe_2$ | $1.07 \times 10^{-5}$ | $6.9 \times 10^5$ | 7.402 | 70.0 |
| $RuTe_2$ | $2.22 \times 10^{-5}$ | $6.5 \times 10^5$ | 14.449 | 137.1 |
| $RhTe_2$ | $1.59 \times 10^{-5}$ | $7.2 \times 10^5$ | 11.494 | 109.1 |
| $PdTe_2$ | $1.59 \times 10^{-5}$ | $7.9 \times 10^5$ | 12.631 | 119.9 |
| $AgTe_2$ | $1.28 \times 10^{-5}$ | $6.9 \times 10^5$ | 8.877 | 84.3 |
| $OsTe_2$ | $2.25 \times 10^{-5}$ | $5.0 \times 10^5$ | 11.272 | 107.0 |
| $IrTe_2$ | $1.84 \times 10^{-5}$ | $6.0 \times 10^5$ | 11.126 | 105.6 |
| $PtTe_2$ | $2.80 \times 10^{-5}$ | $8.8 \times 10^5$ | 24.626 | 233.7 |
| $AuTe_2$ | $1.02 \times 10^{-5}$ | $6.3 \times 10^5$ | 6.392 | 60.7 |
| $CuSe_2$ | $1.01 \times 10^{-5}$ | $7.1 \times 10^5$ | 7.130 | 67.7 |
| $RuSe_2$ | $3.05 \times 10^{-5}$ | $5.0 \times 10^5$ | 15.151 | 143.8 |
| $RhSe_2$ | $1.96 \times 10^{-5}$ | $6.7 \times 10^5$ | 13.146 | 124.8 |
| $PdSe_2$ | $2.16 \times 10^{-5}$ | $9.2 \times 10^5$ | 19.860 | 188.5 |
| $AgSe_2$ | $1.03 \times 10^{-5}$ | $6.9 \times 10^5$ | 7.142 | 67.8 |
| $OsSe_2$ | $2.35 \times 10^{-5}$ | $3.2 \times 10^5$ | 7.397 | 70.2 |
| $IrSe_2$ | $2.41 \times 10^{-5}$ | $3.9 \times 10^5$ | 9.302 | 88.3 |
| $AuSe_2$ | $8.52 \times 10^{-6}$ | $6.5 \times 10^5$ | 5.502 | 52.2 |
| $TiTe_2$ | $4.44 \times 10^{-5}$ | $4.0 \times 10^5$ | 17.624 | 167.3 |

The product of the resistivity (ρ) and the absorption coefficient (α) may represent the product of sheet resistance ($R_s$) and transmittance (−ln T) according to the equation, wherein T is transmittance. Accordingly, a compound having a lower value of p*a may be advantageous for a material of the electrically conductive thin film.

$e^{-\alpha t} = T$ (i.e., $\alpha t = -\ln T$)

$R_s = \rho/t$

∴ $\rho * \alpha = R_s * (-\ln T)$

α: absorption coefficient
ρ: resistivity
T: transmittance (at λ=550 nm)
t: thickness
Rs: sheet resistance The compound included in the electrically conductive thin film according to the an embodiment may have a product of the absorption coefficient and the resistivity (i.e., $R_s*(-\ln T)$) of less than or equal to about 30, for example, less than or equal to about 20, or about 1 to about 30, or about 2 to about 25, so as to provide an electrically conductive thin film having high conductivity and excellent transparency (i.e., low sheet resistance and high light transmittance).

The electrically conductive thin film according to an embodiment includes an inorganic material including a metal and a non-metal element, and may have very high conductivity even at a thin thickness. Without being bound by any particular theory, it is believed that the aforementioned electrically conductive thin films may exhibit very high conductivity with high transparency as they include electrons that are two-dimensionally confined in the layered crystal structure, and the electrons may move with high mobility even in a very thin film with a small thickness.

In addition, the electrically conductive thin film including the compound having a layered crystal structure may undergo interlayer sliding to provide improved flexibility. According to an embodiment, the layered crystal structure of a rare earth chalcogenide compound represented by Chemical Formula 1 may belong to a hexagonal system having a space group of P3m1 (space group number 164).

According to an embodiment, the electrically conductive thin film may be produced by preparing a starting material of a metal dichalcogenide compound of Chemical Formula 1, a polycrystalline or monocrystalline bulk material prepared therefrom, or a powder obtained from the bulk material, and conducting an appropriate method such as vapor deposition or the like with the starting material powder, the prepared bulk material, or a powder thereof to form a conductive thin film (e.g., a transparent conductive layer). Alternatively, the electrically conductive thin film may be obtained by liquid phase exfoliation of the powder of the bulk material to provide nanosheets and forming the obtained nanosheets into a thin film.

The starting material of the metal dichalcogenide compound may include each element or a compound including each element. For example, the starting material may include elemental Ru, Os, Re, Rh, Ir, Pd, Pt, Cu, Ag, or Au, or compound comprising Ru, Os, Re, Rh, Ir, Pd, Pt, Cu, Ag, or Au. For example, the starting material may comprise sulfur, selenium, tellurium, or combination thereof. According to an embodiment, the starting material may be a compound of the above metal and sulfur, selenium, tellurium, or a combination thereof.

The polycrystalline bulk material may be prepared from the above starting material using a quartz ampoule method, an arc melting method, a solid-state reaction method, and the like. For example, the quartz ampoule method includes introducing the starting material into a quartz tube or an ampoule made of a metal, sealing the same under vacuum, and heating the same to perform a solid-phase reaction or a melting process. The arc melting method includes introducing a starting material element into a chamber, performing an arc discharge process under an inert gas (e.g., nitrogen, argon, etc.) atmosphere to melt the starting material element, and solidifying the same. The solid-state reaction method may include mixing the starting material powders, either pelletizing and then heat-treating the resulting mixture or heat-treating and then pelletizing the same, and finally sintering the pellet thus prepared.

The obtained polycrystalline bulk material may be subjected to a sintering process to produce a highly densified product. The highly densified product may be used as a specimen for measuring electrical conductivity. Such a densification process may be performed by a hot pressing method, a spark plasma sintering method, a hot forging method, or the like. The hot pressing method includes applying the pulverized compound into a mold having a predetermined shape, and forming the same at a high temperature of, for example, about 300° C. to about 800° C. under a high pressure of, for example, about 1 megapascals (MPa) to about 300 megapascals (MPa) (e.g., 30 MPa to 300 MPa). The spark plasma sintering method includes applying the pulverized compound with high voltage current under a high pressure, for example, with a current of about 50 amperes (A) to about 500 A under a pressure of about 30 MPa to about 300 MPa to sinter the material within a short period of time. The hot forging method may include compressing and sintering the powder compound at a high temperature of, for example, about 300° C. to about 700° C.

The monocrystalline material may be obtained by preparation of a crystalline ingot or by growth of a monocrystal. The crystalline ingot may be obtained by heating a congruent melting material to a temperature higher than the melting point of the material and then slowly cooling the same. For example, the starting material mixture may be introduced into a quartz ampoule, melted after sealing the ampoule under vacuum, and then the melted mixture slowly cooled to provide a crystalline ingot. The crystal grain size may be selected by selecting the cooling speed of the melted mixture. The growth of the monocrystal may be performed by a metal flux method, a Bridgman method, an optical floating zone method, a vapor transport method, or the like. The metal flux method is a method including melting the starting material powder in a crucible together with additional flux at a high temperature, and slowly cooling the same to grow crystals at a predetermined temperature. The Bridgman method includes introducing the starting material element into a crucible and heating the same at a high temperature until the starting material element is dissolved at the terminal end of the crucible, and then slowly moving the high temperature zone and locally dissolving the sample to pass the entire sample through the high temperature zone, so as to grow a crystal. The optical floating zone method is a method including forming a starting material element into a rod-shaped seed rod and a feed rod, locally melting the sample at a high temperature by focusing lamp light on the feed rod, and slowly pulling up the melted part to grow a crystal. The vapor transport method includes introducing the starting material element into the bottom part of a quartz tube and heating the starting material element, and maintaining the upper part of the quartz tube at a low temperature to perform a solid-phase reaction with a vaporized starting material element at a low temperature and thereby to grow a crystal. The electrical conductivity of the obtained monocrystal material may be measured according to a DC 4-terminal method.

The obtained polycrystalline or monocrystalline bulk material may be pulverized to provide a crystalline powder. The pulverization may be performed by any suitable method such as a ball milling without particular limitation. After the pulverization, the powder having a uniform size may be provided using, for example, a sieve.

The obtained polycrystalline or monocrystalline bulk material is used as a target or the like of vapor deposition to provide a thin continuous film (i.e., an electrically conductive thin film) including the compound. The vapor deposition may be performed by a physical vapor deposition method such as a thermal evaporation, sputtering, chemical vapor deposition (CVD), atomic layer deposition (ALD), or pulsed laser deposition. The deposition may be performed using any suitable known or commercially available apparatus. The deposition conditions may vary with the types of the compound and the deposition method, but are not particularly limited.

According to another embodiment, the bulk material of the above compound or the powder thereof may be subjected to liquid phase exfoliation to provide a plurality of nanosheets, which are then brought into contact with each other so as to provide an electrical connection, thereby providing an electrically conductive thin film.

In the liquid phase exfoliation, the bulk material or the powder thereof may be subjected to ultra-sonication in an appropriate solvent. Examples of the solvent suitable for the liquid phase exfoliation may include, but are not limited to, water, an alcohol (e.g., isopropyl alcohol, ethanol, or methanol), N-methyl pyrrolidone (NMP), hexane, benzene, dichlorobenzene, toluene, chloroform, diethylether, dichloromethane (DCM), tetrahydrofuran (THF), ethylacetate (EtOAc), acetone, dimethyl formamide (DMF), acetonitrile (MeCN), dimethyl sulfoxide (DMSO), ethylene carbonate, propylene carbonate, γ-butyrolactone, γ-valerolactone, a perfluorinated aromatic solvent (e.g., hexafluorobenzene, octafluorotoluene, pentafluorobenzonitrile, and pentafluoropyridine). A combination comprising at least two of the foregoing solvents may be used.

The solvent may further include an additive such as a surfactant in order to facilitate the exfoliation and prevent the exfoliated nanosheets from being agglomerated. Examples of the surfactant may include sodium dodecyl sulfate (SDS) and sodium dodecyl benzenesulfonate (SDBS).

The ultrasonication may be performed using any suitable available ultrasonication device, and the conditions thereof (e.g., ultrasonication time) are not particularly limited, but may be appropriately selected considering a solvent used and a powder concentration in the solvent. For example, the ultrasonication may be performed for greater than or equal to about 1 hour, for example, for about 1 hour to about 100 hours, but is not limited thereto. The powder concentration in the solvent may be greater than or equal to about 0.01 grams per milliliter (g/mL), for example, within a range of about 0.01 g/mL to about 1 g/L, but is not limited thereto.

In order to promote the exfoliation, lithium atoms may be intercalated into the compound having an layered crystal structure. According to an embodiment, the compound is contacted with, e.g., immersed in, a solution comprising an alkyl lithium compound (e.g., a C2 to C8 alkyl lithium compound such as butyllithium) in an aliphatic hydrocarbon solvent such as hexane to intercalate lithium atoms into the compound, and the obtained product is subjected to ultrasonication to provide a plurality of nanosheets including the compound. For example, by disposing the obtained product in water, water and the intercalated lithium ions may react to generate hydrogen between layers of the crystal structure, so as to accelerate the interlayer separation. The obtained nanosheets are separated according to an appropriate method (e.g., centrifugation) and washed.

In the electrically conductive thin film including the nanosheets (e.g., nanoflakes), the nanosheets physically contact one another to provide an electrical connection. As the nanosheets physically contact to form a thin film, the prepared film may provide enhanced transmittance. The length of nanosheets is not particularly limited, and may be appropriately selected. For example, the nanosheet may have a length of less than or equal to about 500 μm, for example, of about 10 nm to about 500 μm, about 20 nm to about 50 μm, or about 10 nm to about 10 μm, but is not limited thereto. The nanosheets may have a thickness of less than or equal to about 100 nm, about 1 nm to about 100 nm, or about 2 nm to about 80 nm, but it is not limited thereto. The obtained film may have coverage of greater than or equal to about 50%, about 50% to 100%, or about 55% to about 98%, based on a total area of a substrate on which the film is disposed. The obtained film may have high transmittance, e.g., a transmittance of greater than or equal to about 80%, or greater than or equal to about 85%, or about 80% to 100%, or about 85% to about 98% for light having a wavelength of 550 nm, when the thickness is less than or equal to about 20 nm, for example, less than or equal to about 5 nm, about 1 nm to about 50 nm, or about 2 nm to about 40 nm. In an embodiment, a thickness of the electrically conductive thin film may be about 1 nm to about 50 nm, about 2 nm to about 40 nm, or about 3 nm to about 30 nm. The electrically conductive thin film may have a Young's modulus, i.e., a tensile modulus, of about 0.01 gigapascals (GPa) to about 10 GPa, about 0.05 GPa to about 8 GPa, about 0.1 GPa to about 6 GPa, or about 0.5 GPa to about 4 GPa. Also the electrically conductive thin film may maintain its conductive properties after being flexed. For example the electrically conductive thin film when disposed on a suitable substrate such as a polyethyleneterephthalate substrate, has an electrical conductivity after bending 180° around a rod having a diameter 10 millimeters which is about 80% to 100%, about 85% to about 99%, or about 90% to about 98% of an electrical conductivity before the bending when determined by a DC (constant current) four-probe method.

The formation of a film using the nanosheets may be conducted by any suitable method. For example, the formation of the film may be performed by dip coating, spray coating, printing after forming an ink or a paste, and the like.

According to an embodiment, the manufactured nanosheets contacted with, e.g., are added to, deionized water, and the resulting dispersion is ultrasonicated again. An organic solvent that is not miscible with water (e.g., an aromatic hydrocarbon such as xylene or toluene) is added to the ultrasonicated dispersion. When the mixture thus obtained is shaken, a thin film including nanosheets is formed at the interface between the water and the organic solvent. When a clean, wetted, and oxygen plasma-treated glass substrate is slightly dipped to the interface and taken out, the thin film including nanosheets is spread out on the substrate at the interface. The thickness of the thin film may be selected by controlling a concentration of the nanosheets per area on the surface of the water/organic solvent and a speed/angle when the substrate is removed from the mixture comprising the nanosheets.

The electrically conductive thin film provides high conductivity, enhanced light transmittance, and excellent flexibility, and thus may replace an electrode including a transparent conductive oxide such as ITO, ZnO, and the like and a transparent film including an Ag nanowire.

Another embodiment provides an electronic device including the above electrically conductive thin film. The electrically conductive thin film included in the electronic device may be the same as disclosed above. The electronic device may include, for example, a flat panel display (e.g., a LCD, LED, or an OLED), a touch screen panel, a solar cell, an e-window, a heat mirror, a transparent transistor, or a flexible display, but is not limited thereto.

Figure 7:
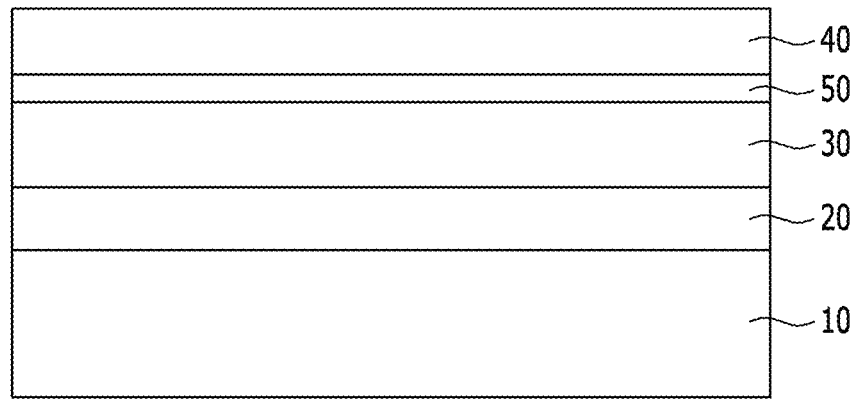
FIG. 7 is a cross-sectional view of an embodiment of an organic light emitting diode device including an electrically conductive thin film.

FIG. 7 is a cross-sectional view of an embodiment of an organic light emitting diode device including an electrically conductive thin film.

An organic light emitting diode device according to an embodiment includes a substrate 10, a lower electrode 20, an upper electrode 40 facing the lower electrode 20, and an emission layer 30 interposed between the lower electrode 20 and the upper electrode 40.

The substrate 10 may comprise an inorganic material such as a glass, or an organic material such as polycarbonate, polymethyl methacrylate, polyethylene terephthalate, polyethylene naphthalate, polyamide, polyethersulfone, or a combination thereof, or a silicon wafer. A combination comprising at least two of the foregoing substrates may be used.

One of the lower electrode 20 and the upper electrode 40 is a cathode and the other is an anode. For example, the lower electrode 20 may be an anode and the upper electrode 40 may be a cathode.

At least one of the lower electrode 20 and the upper electrode 40 may be a transparent electrode. When the lower electrode 20 is a transparent electrode, the organic light emitting diode device may have a bottom emission structure in which light is emitted toward the substrate 10, while when the upper electrode 40 is a transparent electrode, the organic light emitting diode device may have a top emission structure in which light is emitted away from the substrate 10. In addition, when the lower electrode 20 and upper electrode 40 are both transparent electrodes, light may be emitted toward the substrate 10 and away from the substrate 10.

The transparent electrode may include the above electrically conductive thin film. The electrically conductive thin film is the same as described above. The electrically conductive thin film may have high electron density. The electrically conductive thin film may be used to replace a LiF/Al or MgAg alloy.

The emission layer 30 may comprise an organic material which emits a primary colors such as red, green, blue, and the like, or a mixture of an inorganic material with the organic material, for example, a polyfluorene derivative, a (poly)paraphenylene vinylene derivative, a polyphenylene derivative, a polyvinylcarbazole or its derivative, a polythiophene derivative, or a compound prepared by doping these polymer materials with a perylene-based pigment, a coumarin-based pigment, a rhodamine-based pigment, rubrene, perylene, 9,10-diphenylanthracene, tetraphenylbutadiene, Nile red, coumarin, quinacridone, and the like. An organic light emitting diode device displays a desirable image by a spatial combination of primary colors emitted by an emission layer therein.

The emission layer 30 may emit white light by combining basic colors such as the three primary colors of red, green, and blue, and in this case, the color combination may emit white light by combining the colors of adjacent pixels or by combining colors laminated in a perpendicular direction.

An auxiliary layer 50 may be positioned between the emission layer 30 and the upper electrode 40 to improve luminous efficiency of the emission layer 30. In the drawing, the auxiliary layer 50 is shown only between the emission layer 30 and the upper electrode 40, but it is not limited thereto. The auxiliary layer 50 may be positioned between the emission layer 30 and the lower electrode 20, or between the emission layer 30 and the upper electrode 40 and between the emission layer 30 and the lower electrode 20.

The auxiliary layer 50 may include an electron transport layer (ETL) and a hole transport layer (HTL) for balancing between electrons and holes, an electron injection layer (EIL), a hole injection layer (HIL) for reinforcing injection of electrons and holes, and the like. It may include one or more layers selected therefrom.

In addition, an example of applying the electrically conductive thin film to an organic light emitting diode device is illustrated. Also, the electrically conductive thin film may be used as an electrode for an electronic device including a transparent electrode without a particular limit, for example, as a pixel electrode and/or a common electrode for a liquid crystal display (LCD), an anode and/or a cathode for an organic light emitting diode device, a display electrode for a plasma display device, and a transparent electrode for a touch screen panel device.

Hereinafter, embodiments are illustrated in more detail with reference to examples. These examples, however, are not in any sense to be interpreted as limiting the scope of this disclosure.

EXAMPLES

Example 1

Preparation of Polycrystalline Sintered Body

A polycrystalline sintered body is prepared in the following manner.

In a glove box, gold (Au), palladium (Pd), or platinum (Pt) (purity: 99.9%, manufacturer: R&D Korea Co., Ltd.) are each mixed with elemental tellurium (purity: 99.99%, manufacturer: R&D Korea Co., Ltd.) in a mole ratio of 1:2 to provide a binary mixture. The prepared mixture is introduced into a quartz glass tube, and the tube is sealed under a vacuum. The quartz glass tube is introduced into a box furnace and heated to 800° C. (for Au, Pd), 1100° C., or 1200° C. (for Pt) at a heating rate of 100 degrees Celsius per hour (° C./h), respectively, and is maintained at the same temperature for one day and is slowly cooled to room temperature (performing a solid-state method).

The obtained sample is pulverized and is subjected to a spark-plasma sintering (SPS) process using SPS equipment (manufactured by Fuji Electronic Industrial Co., Ltd. Model name: Dr. Sinter) at a temperature of 600° C. under a pressure 70 MPa.

For the obtained sintered body, electrical conductivity is measured using ULVAC-Riko ZEM-3 equipment according to the DC 4 terminal method under the conditions of room temperature/normal pressure, and the results are compiled in Table 4.

Figure 2:
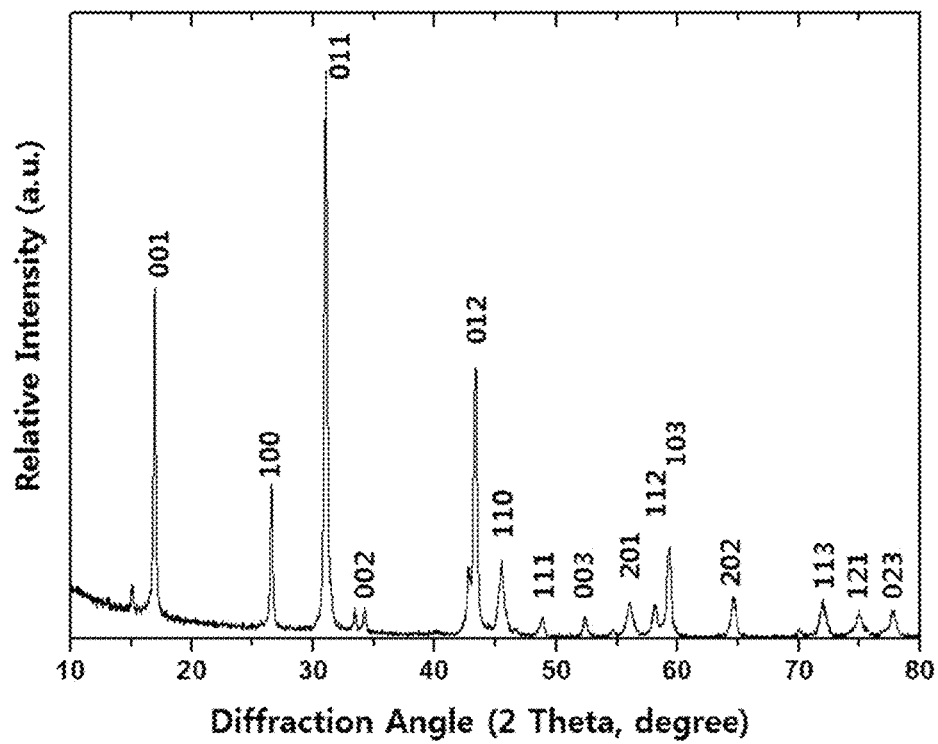
FIG. 2 is a graph of relative intensity (arbitrary units) versus diffraction angle (degrees two-theta, ° 2θ) and is an X-ray diffraction spectrum of a $PtTe_2$ polycrystalline sintered body prepared from Example 1.
Figure 3A:
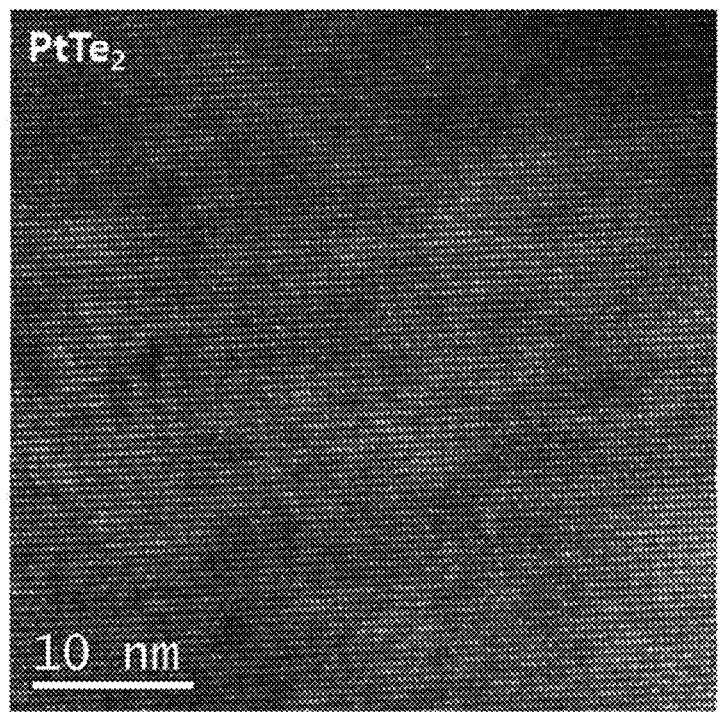
FIGS. 3A and 3B shows the results of transmission electron microscopic analysis of an exfoliated sample obtained by mechanical exfoliation of a $PtTe_2$ polycrystalline sintered body in Example 3.
Figure 3B:
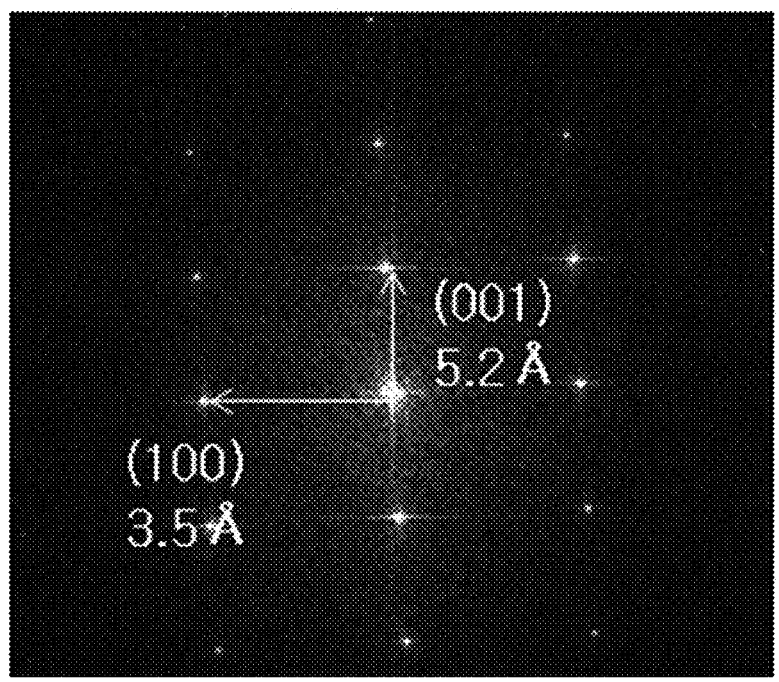

For each of the platinum ditelluride sintered body and the palladium ditelluride sintered body, X-ray diffraction analysis is made and the results thereof are shown in FIG. 1 and FIG. 2. The results of FIG. 1 confirm that the $PdTe_2$ sintered body includes palladium ditelluride having a layered crystal structure belonging to a hexagonal system with a space group of P$\bar{3}$m1 (164).

The results of FIG. 2 confirm that the $PtTe_2$ sintered body includes platinum ditelluride having a layered crystal structure belonging to a hexagonal system with a space group of P$\bar{3}$m1 (164).

TABLE 4

| Composition | Electrical conductivity (S/cm) | |
|---|---|---|
| | Polycrystalline | Mono-crystalline |
| $AuTe_2$ | 4330 | – |
| $PtTe_2$ | 21,000 | 21,700 |
| $PdTe_2$ | 34,400 | 34,600 |

The results of Table 4 confirm that the dichalcogenide compounds according to the example have high conductivity.

Example 2

Preparation of Monocrystal

In a glove box, palladium (purity: 99.99%, manufacturer: R&D Korea Co., Ltd.) or platinum (purity: 99.99%, manufacturer: R&D Korea Co., Ltd.) are each mixed with elemental tellurium (purity: 99.99%, manufacturer: R&D Korea Co., Ltd.) at a mole ratio of 1:2 to provide a binary mixture. The prepared mixture is introduced into a quartz glass tube, and the tube is sealed under a vacuum condition. The quartz glass tube is put into a box furnace and heated to 750° C. (for the palladium mixture) or 1150° C. (for the platinum mixture) at a rate of 100° C./h, and is maintained at this temperature for a time period of about one hour to about 5 hours. Then, the temperature of the melted product is decreased to 550° C. (for the palladium mixture) or to 950° C. (for the platinum mixture) at a rate of about 1° C./h to 2° C./h to grow a large grain-sized crystal ingot. The grown crystal ingot is cooled to room temperature.

The electrical conductivity of the obtained monocrystal is measured using ULVAC-Riko ZEM-3 equipment under the room temperature/normal pressure condition according to the DC 4 terminal method, and the results are compiled in the above Table 4. The results confirm that the electrical conductivity of the monocrystal is slightly higher than that of the polycrystal sintered body.

Example 3

Preparation of $PtTe_2$ Microflakes and its TEM-EDS Analysis

The $PtTe_2$ sintered body obtained from Example 1 is mechanically exfoliated to obtain a microflake having a thickness of 100 nm using 3M Scotch tape according to a method set forth in K. S. Novoselov et al., "Electric Field Effect in Atomically Thin Carbon Films," Science Vol. 306, p. 666 (2004), the content of which is incorporated herein by reference in its entirety.

Using a transmission electron microscope (TEM) (TEC-NAI F30 U-TWIN), a TEM analysis and Energy Dispersive X-ray spectroscopy are conducted, and the results are shown in FIGS. 3A and 3B and FIGS. 4A to 4C. The results of FIGS. 3A and 3B and FIGS. 4A to 4C confirm that no oxide layer is present in the $PtTe_2$ exfoliated sample.

Figure 4A:
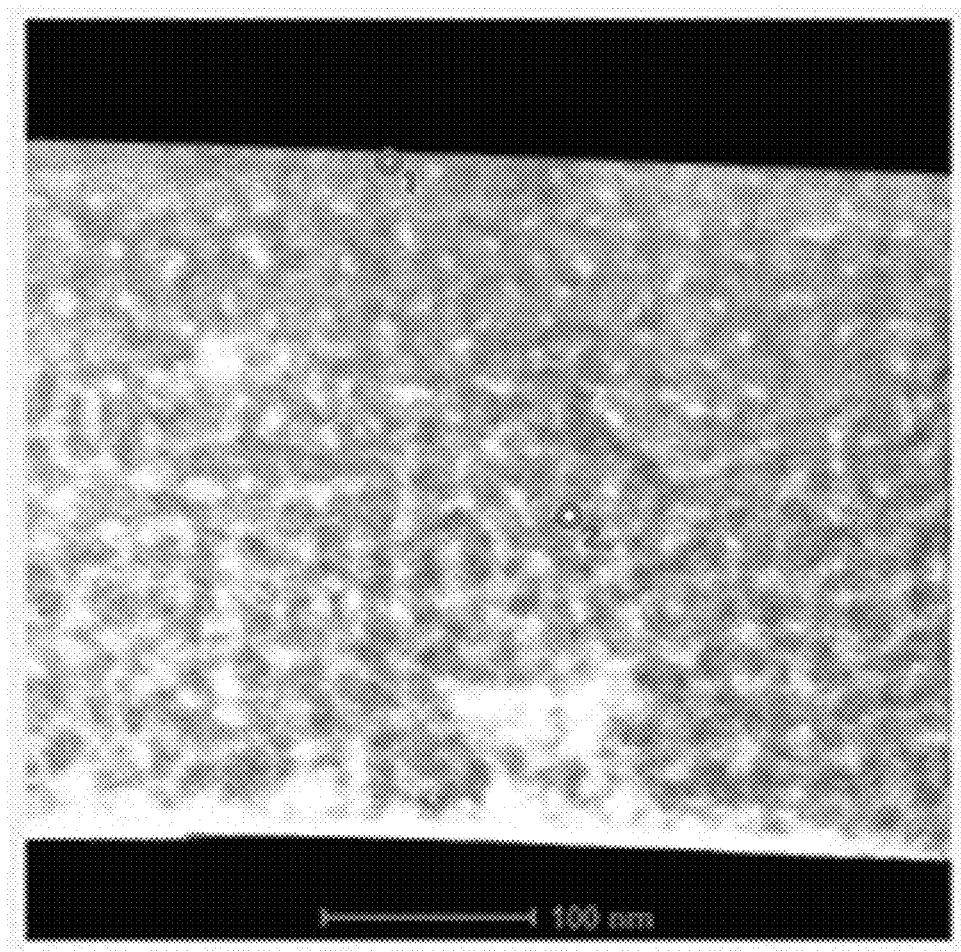
Figure 4B:
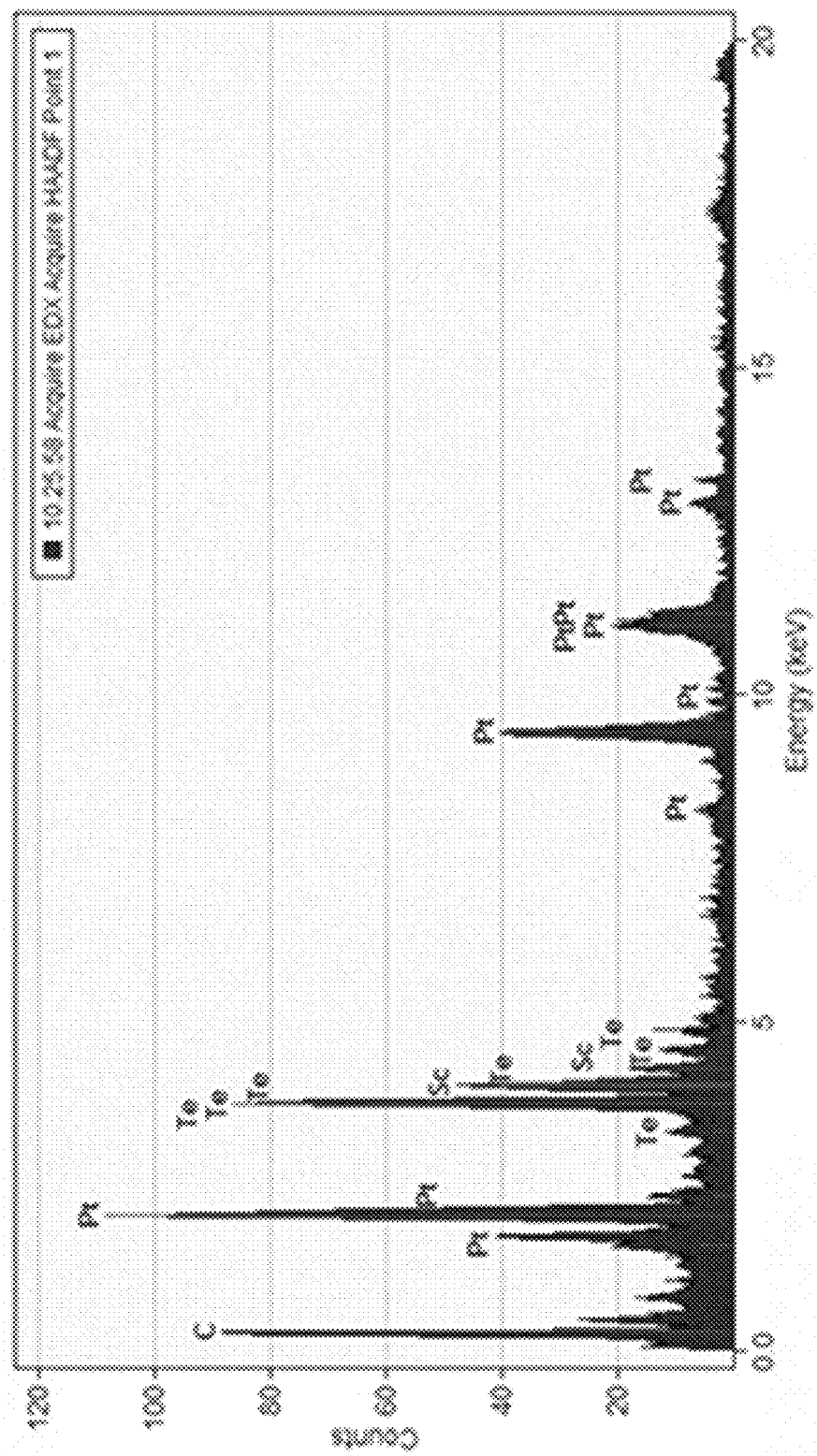
Figure 4C:
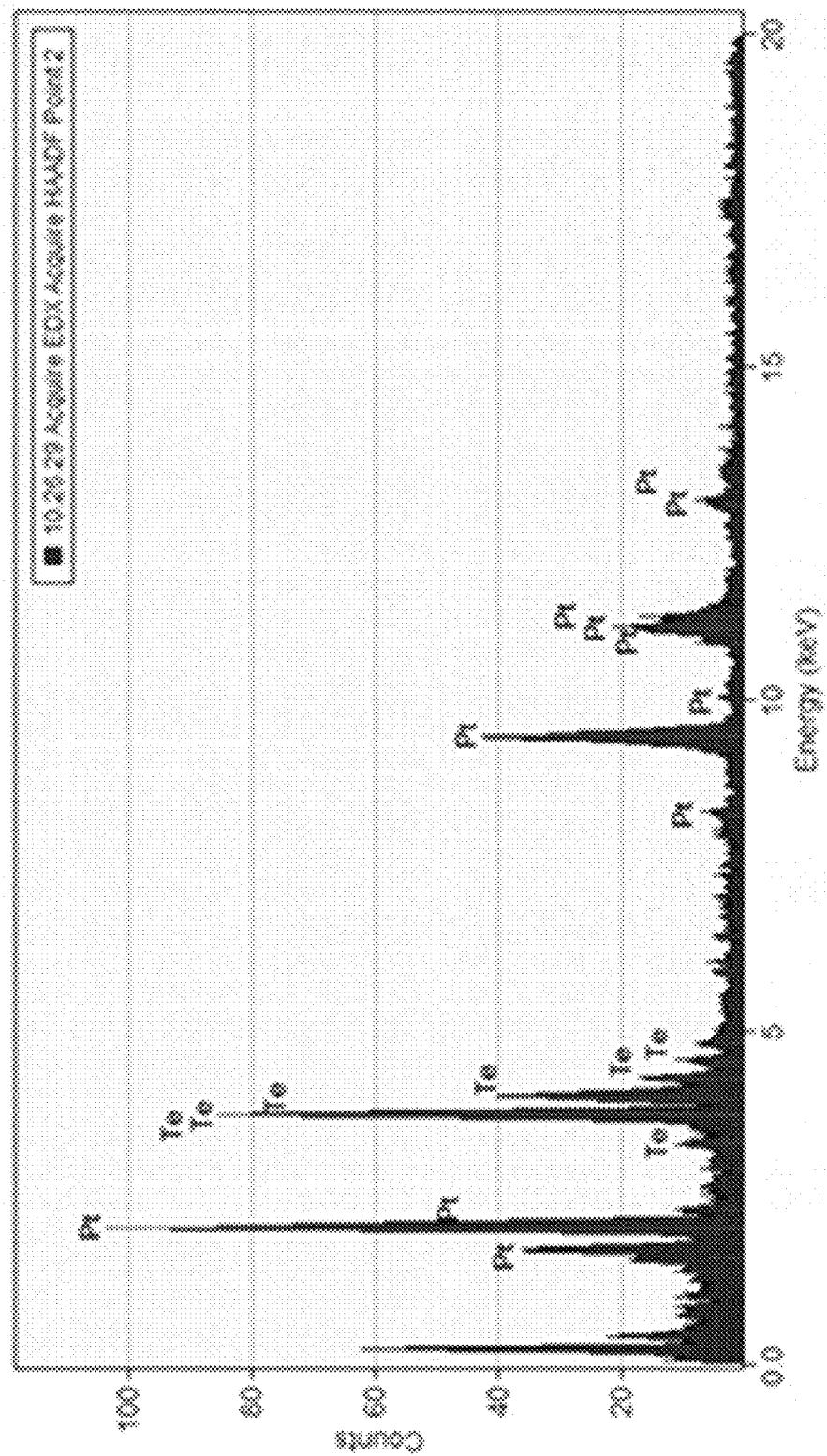

The energy dispersive X-ray analysis of location 1 in FIG. 4A determined that the Pt content was 45.5 atomic percent (at %) and the Te content was 54.5 at %. The energy dispersive X-ray analysis of location 2 in FIG. 4A determined that the Pt content was 47.8 at % and the Te content was 52.2 at %.

Example 4

Preparation of $PdTe_2$ Microflakes and its TEM-EDS Analysis

Figure 5A:
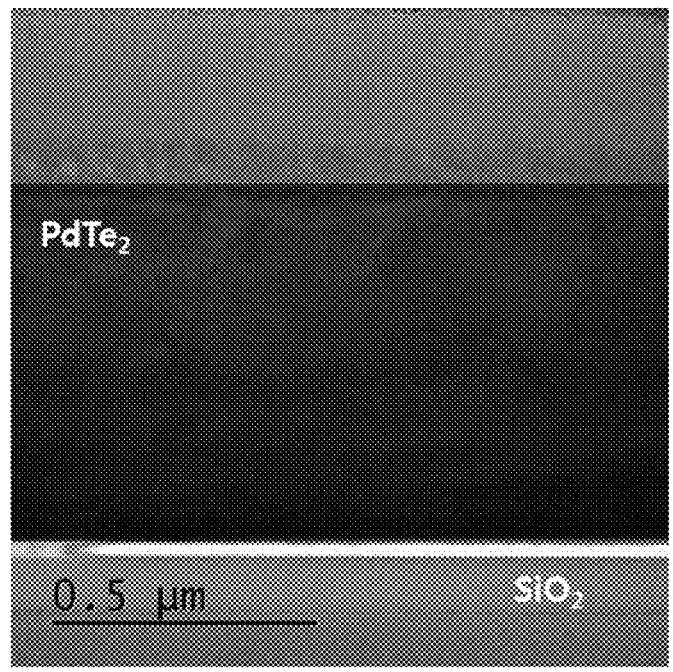
Figure 5B:
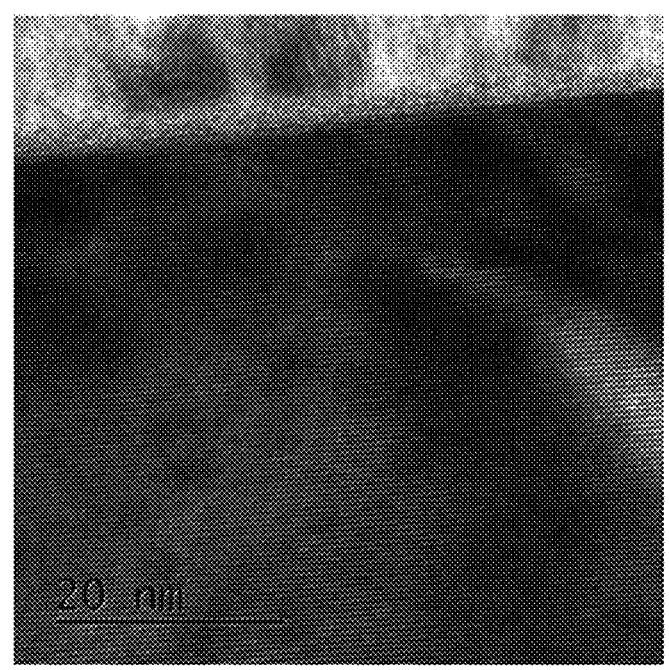

The $PdTe_2$ sintered body obtained from Example 1 is mechanically exfoliated to obtain a microflake having a thickness of 100 nm using 3M Scotch tape in the same manner as set forth in Example 3. Using a transmission electron microscope (TEM) (from TECNAI F30 U-TWIN), a TEM analysis is conducted for the exfoliated sample thus obtained, and the results are shown in FIGS. 5A and 5B. The results of FIGS. 5A and 5B confirm that no oxide layer is present in the $PdTe_2$ exfoliated sample.

Comparative Example 1

Preparation of $TiTe_2$ Microflakes and its TEM-EDS Analysis

A $TiTe_2$ sintered body is obtained in the same manner set forth in Example 1 except for using titanium as the metal element. The $TiTe_2$ sintered body thus prepared is mechanically exfoliated to obtain a nanoflake having a thickness of 100 nm using 3M Scotch tape in the same manner as set forth in Example 3. Using a transmission electron microscope (TEM) (from TECNAI F30 U-TWIN), a TEM analysis is conducted for the exfoliated sample thus obtained, and the results are shown in FIGS. 6A to 6E. The results of FIGS. 6A to 6E confirm that the $TiTe_2$ exfoliated sample includes an amorphous layer having a thickness of less than about 10 nm, which is considered to be a native oxide layer. Energy dispersive analysis provided the results provided in Table 5.

TABLE 5

Analysis of points P1 to P4 in FIG. 6A

| | O (at %) | Ti (at %) | Te (at %) |
|---|---|---|---|
| P1 | 48.8 | 24.1 | 27.2 |
| P2 | 0.7 | 34.4 | 64.9 |
| P3 | 5.3 | 31.1 | 63.6 |
| P4 | 53.5 | 15.1 | 31.3 |

Example 5

Manufacture of PdTe$_2$ Thin Film

Pulsed laser deposition (PLD) is conducted on an Al$_2$O$_3$ substrate under the following conditions using the PdTe$_2$ sintered body prepared from Example 1 as a target and using a Nd/YAG laser.

PLD device: PLD 5000 Deposition Systems, PVD Products

Output: 60 mJ/cm$^2$

Time: 20 min

Substrate temperature: 600° C.

Vacuum degree: 2*10$^{-6}$ Pa

The obtained PdTe$_2$ deposition film has a thickness of about 20 nm.

Example 6

Manufacture of Thin Film Including PdTe$_2$ Nanosheets

The PdTe$_2$ sintered body prepared from Example 1 is pulverized and 0.1 grams (g) of the obtained powder is dispersed in 100 mL of hexane including butyllithium dissolved therein, and the resulting dispersion is agitated for 72 hours. Then, the powder is taken out from the dispersion and washed with hexane and dried under an argon atmosphere to obtain lithium intercalated powder of PdTe$_2$. The lithium intercalated powder of PdTe$_2$ is placed in a vial in a glove box, and then a predetermined amount of water is added thereto and the resulting mixture is subjected to ultrasonication for one hour. With the generation of hydrogen gas, interlayer separation occurs to provide PdTe$_2$ nanosheets.

The obtained nanosheets are centrifuged, and then the precipitate is washed with water and centrifuged again.

The obtained nanosheet precipitate is placed in a vial and added with 3 mL of deionized water and ultrasonicated. 2-3 mL of toluene is added thereto, and the vial is stirred to provide a thin film including nanosheets at the interface between the aqueous layer and the toluene layer. A glass substrate treated with oxygen plasma is slightly dipped into the interface and pulled up so that a film including the PdTe$_2$ nanosheets present at the interface is spread on the glass substrate.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electrically conductive film comprising:
a compound represented by Chemical Formula 1 and having a layered crystal structure:

MeCh$_2$          Chemical Formula 1 wherein Me is Ir, Pd, Pt, Ag or Au, and Ch is tellurium,
wherein the electrically conductive film comprises a plurality of nanosheets comprising the compound of Chemical Formula 1 or the electrically conductive film is in the form of a continuous film comprising the compound of Chemical Formula 1,
wherein the electrically conductive film has a thickness of less than or equal to about 50 nanometers,
wherein the electrically conductive film has transmittance of greater than or equal to about 80% at a thickness of less than or equal to 50 nm for light having a wavelength of 550 nm,
wherein the compound of Chemical Formula 1 is PdTe$_2$, AgTe$_2$, IrTe$_2$, PtTe$_2$, AuTe$_2$, or a combination thereof, and
wherein a product of α and ρ is less than or equal to about 30 ohms per square, wherein α is an absorption coefficient of the compound for light having a wavelength of 550 nm and ρ is a resistivity value of the compound.

2. The electrically conductive film of claim 1, wherein an oxide content of the electrically conductive film is less than about 2 weight percent, based on a total weight of the electrically conductive film.

3. The electrically conductive film of claim 1, wherein the the electrically conductive film has an electrical conductivity of greater than or equal to about 10,000 Siemens per centimeter.

4. The electrically conductive film of claim 1, wherein the electrically conductive film does not comprise an oxide layer on a surface thereof as observed by transmission electron microscopy.

5. The electrically conductive film of claim 1, wherein the electrically conductive film has an electrical conductivity of greater than or equal to about 4300 Siemens per centimeter.

6. The electrically conductive film of claim 5, wherein the electrically conductive film has an electrical conductivity after bending 180° around a rod having a diameter 10 millimeters which is about 80% to 100% of an electrical conductivity before the bending, when determined by a DC (constant current) four-probe method.

7. The electrically conductive film of claim 1, wherein the layered crystal structure belongs to a hexagonal system and has a space group of P$\bar{3}$m1.

8. The electrically conductive film of claim 1, wherein the compound is monocrystalline.

9. The electrically conductive film of claim 1, wherein the electrically conductive film comprises a plurality of nanosheets comprising the compound of Chemical Formula 1, and wherein the nanosheets contact one another to provide an electrical connection.

10. The electrically conductive film of claim 1, wherein the electrically conductive film has a coverage of greater than or equal to about 50%, based on a total area of a substrate on which the film is disposed.

11. An electronic device comprising an electrically conductive film comprising a compound being represented by the following Chemical Formula 1 and having a layered crystal structure:

MeCh$_2$          Chemical Formula 1 wherein Me is Ir, Pd, Pt, Ag or Au, and Ch is tellurium,
wherein the electrically conductive film comprises a plurality of nanosheets comprising the compound of Chemical Formula 1 or the electrically conductive film is in the form of a continuous film comprising the compound of Chemical Formula 1,
wherein the electrically conductive film has a thickness of less than or equal to about 50 nanometers, wherein the electrically conductive film has transmittance of greater than or equal to about 80% at a thickness of less than or equal to 50 nm for light having a wavelength of 550 nm,
wherein the compound of Chemical Formula 1 of the electrically conductive film comprises $PdTe_2$, $AgTe_2$, $IrTe_2$, $PtTe_2$, $AuTe_2$, or a combination thereof, and
wherein a product of $\alpha$ and $\rho$ is less than or equal to about 30 ohms per square, wherein $\alpha$ is an absorption coefficient of the compound for light having a wavelength of 550 nm and $\rho$ is a resistivity value of the compound.

12. The electronic device of claim 11, wherein the electrically conductive film has an electrical conductivity of greater than or equal to about 10,000 Siemens per centimeter.

13. The electronic device of claim 11, wherein the electrically conductive film does not include an oxide layer on a surface thereof, as observed by transmission electron microscopy.

14. The electronic device of claim 11, wherein the electrically conductive film has an electrical conductivity of greater than or equal to about 4300 Siemens per centimeter.

15. The electronic device of claim 11, wherein the electrically conductive film comprises a plurality of nanosheets including the compound of Chemical Formula 1, wherein the nanosheets are arranged to provide an electrical connection.

16. The electronic device of claim 11, wherein the electrically conductive film is in a form of a continuous film including the compound.

17. The electronic device of claim 11, wherein the electronic device is a flat panel display, a touch screen panel, a solar cell, an e-window, an electrochromic mirror, a heat mirror, a transparent transistor, or a flexible display.

18. The electronic device of claim 11, wherein the electrically conductive film has a coverage of greater than or equal to about 50%, based on a total area of a substrate on which the film is disposed.

* * * * *